United States Patent
Chen et al.

(10) Patent No.: US 7,779,539 B2
(45) Date of Patent: Aug. 24, 2010

(54) METHOD FOR PREVENTING BROKEN CIRCUITS OF A FLEXIBLE PRINTED CIRCUIT

(75) Inventors: Hui-Ping Chen, Miao-Li County (TW); Chien-Chung Chen, Nan-Tou County (TW); Yu-Ching Chen, Taichung (TW)

(73) Assignee: Au Optronics Corp., Hsinchu (TW)

( * ) Notice: Subject to any disclaimer, the term of this patent is extended or adjusted under 35 U.S.C. 154(b) by 388 days.

(21) Appl. No.: 11/637,788

(22) Filed: Dec. 13, 2006

(65) Prior Publication Data

US 2007/0193771 A1    Aug. 23, 2007

(30) Foreign Application Priority Data

Feb. 17, 2006    (TW) .............................. 95105435 A

(51) Int. Cl.
H05K 3/02    (2006.01)

(52) U.S. Cl. .................. 29/846; 29/402.09; 29/847; 29/848

(58) Field of Classification Search .................. 29/825, 29/846, 847, 848
See application file for complete search history.

(56) References Cited

U.S. PATENT DOCUMENTS

| 3,024,151 | A | * | 3/1962 | Robinson ..................... 156/150 |
| 3,181,986 | A | * | 5/1965 | Pritikin ....................... 156/233 |
| 3,301,730 | A | * | 1/1967 | Spiwak et al. ............... 156/267 |
| 4,722,765 | A | * | 2/1988 | Ambros et al. ................ 216/16 |
| 5,133,118 | A | * | 7/1992 | Lindblad et al. .............. 29/840 |

FOREIGN PATENT DOCUMENTS

| JP | 02-039491 | * | 2/1990 |
| JP | 6 124978 |   | 5/1994 |
| JP | 6314860 A | * | 11/1994 |
| TW | 574837 |   | 2/2004 |
| TW | 584595 |   | 4/2004 |
| TW | 1245591 |   | 12/2005 |
| TW | I245591 |   | 12/2005 |

* cited by examiner

*Primary Examiner*—C. J Arbes
(74) *Attorney, Agent, or Firm*—Birch, Stewart, Kolasch & Birch, LLP

(57) ABSTRACT

A method for preventing broken circuits of an FPC is provided, which is to attach a film to a surface of the FPC so as to enhance the strength of the FPC.

6 Claims, 3 Drawing Sheets

METHOD FOR PREVENTING BROKEN CIRCUITS OF A FLEXIBLE PRINTED CIRCUIT

FIELD OF THE INVENTION

The present invention relates to a method for preventing broken circuits of a flexible printed circuit (FPC), more particularly to a method for attaching a film to a surface of the FPC so as to enhance the hardness of the FPC.

BACKGROUND OF THE INVENTION

With the fast growing of the electric technology development, all kinds of electric products may be based on consumer demand. A slim volume is a must for electronic devices as camera, cell phone, notebook, LED molds, PDA, etc. And it is the point for designing such electronic products.

Since those small electronic devices being smaller, continuously the components as FPC, circuit, display, panel, connector, and the related are gradually smaller as well. There are some cables or flexible FPCs existed among such components mentioned above.

It is to be noted that the flexible FPC features a light weight and a thin volume. When the flexible FPC is fabricated on the panel or tested, the flexible FPC is often inserted in and pulled out from troughs, the circuits of the front end of the FPC are easily caused broken, and the appearance is damaged as well. So, the defect rate is increased.

A general flexible FPC as shown in FIG. 1, which is a schematic lateral view of the flexible FPC in prior arts. The FPC comprises a base board 10, a copper 101, and a cover layer 103. The base board 10 of the flexible FPC is thinner to deflection arbitrarily, and the base board 10 is usually made of PI with yellow-brown color and PET with colorless. There is a copper layer 101 rolled on a surface of the base board 10. The copper layer 101 is etched to form circuit patterns needed by means of chemicals with soul or alkali and light etching procedures. Continuously other procedures as mechanical machining, fabrication, etc. may be processed to mounted components on the base board 10 so as to form the flexible FPC.

Between the base board 10 and copper layer 101 usually needs to add an adhesive 102 for bonding. For the whole thickness of the flexible FPC meeting needs, the thickness of the base board 10 and the adhesive 102 is usually under 0.1 mm. The adhesive 102 is made of epoxy resin or acrylic fiber.

For avoiding the surface of the copper layer 101 of the base board 10 being damaged or contaminated, one more cover layer 103 is coated on the surface of the copper layer 101. The cover layer 103 is a film and has the same material with the base board 10 for protecting the circuits of the copper layer 101.

Referring to the FIG. 2, which is schematic view of the flexible FPC connecting another connecter in prior arts. The flexible FPC 1 can be through a front end of the connector 105 to connect other FPCs or troughs 104 of other lines. Since an endpoint in the trough is formed by means of electroplate tin or lead-tin, and the connector 105 of the flexible FPC 1 is plated with tin of 5~15 μm, which is called "Golden finger". By means of connecting the connector 105 and the trough 104, therefore the flexible FPC is electrically connected other FPCs.

According to mentioned above, with electronic products sizes being gradually smaller, the flexible FPC fabricated in the electronic products shall be thinner than ever to connect different electronic components in a limited space. It is to be noted, the base board of the flexible FPC is comparatively skinny, therefore it is easily deformed while applying a force. Hence, the base board is hardly conveyed by automation. So the tests or fabrication must be manually handled.

While a user inserting in and pull out from the FPC and the connector causes stress focused on the front end of the FPC, particularly, the connector located on the front end and constructed by the "Golden finger" is relatively heavier than the whole FPC. So the contacting lines of the front end are easily occurred broken circuits and damaged the flexible FPC while inserting in and pulling out the FPC from the troughs. It is then that the defect rate is higher than 2.17%.

Further more, in the aspect of testing the appearance of the FPC, the base board is often manually touched so as to scratch the surface or damage the appearance while manually inserting in and pulling out the FPC. Therefore, the defect rate is up to 30%. As a conclusion, how to solve the drawbacks of the broken circuits and the damaged appearance is an important issue in the field.

SUMMARY OF THE INVENTION

The objective of the present invention is to provide a method for preventing broken circuit of a FPC for attaching a film to a surface of the FPC before a plurality of operational procedures so as to enhance hardness of the FPC and reducing possibilities of the broken circuit of the FPC; wherein the operational procedures is defined to test the FPC.

In accordance with the present invention, the test method for preventing broken circuit of the FPC comprises the steps of: (1) attaching a film to a surface of the FPC; (2) inserting in and pulling out repetitively from different troughs to precede a plurality of test operational procedures to the FPC; and (3) stripping the film from the FPC.

In the preferred embodiment, the FPC has a connector to join in the troughs of the step (2), and the film attached to the surface of the FPC is close to the connector. A thickness of the FPC is between 0.09 and 0.12 mm. The FPC is a flexible FPC, and a thickness of the film is smaller than 0.15 mm. The film is made of Polyethylene Terephthalate and low viscosity.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENT

The present invention provides a method for preventing broken circuit of a FPC that a film is attached to a surface of the FPC before operational procedures so as to enhance hardness of the FPC and reduce possibilities of the broken circuit of the FPC while in assembling, including inserting in and pulling out.

Figure 1:
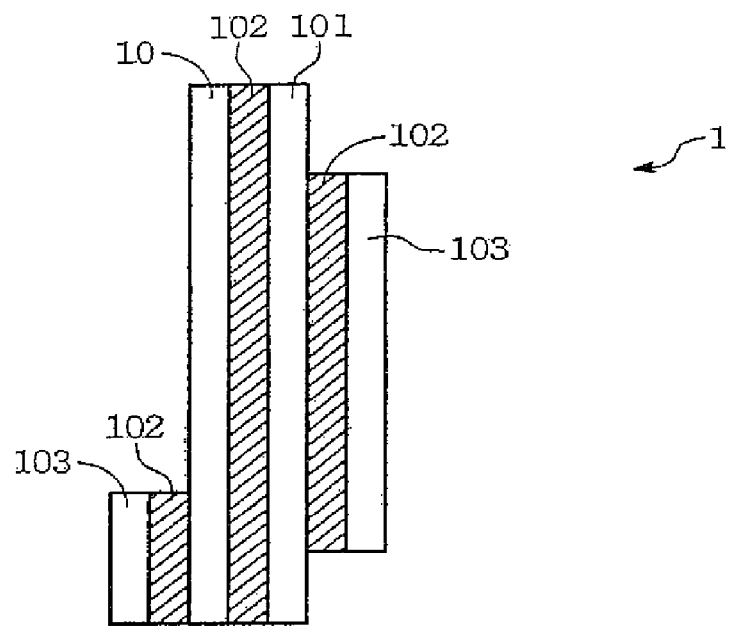
FIG. 1 is a schematic lateral view of the flexible FPC in prior arts.
Figure 2:
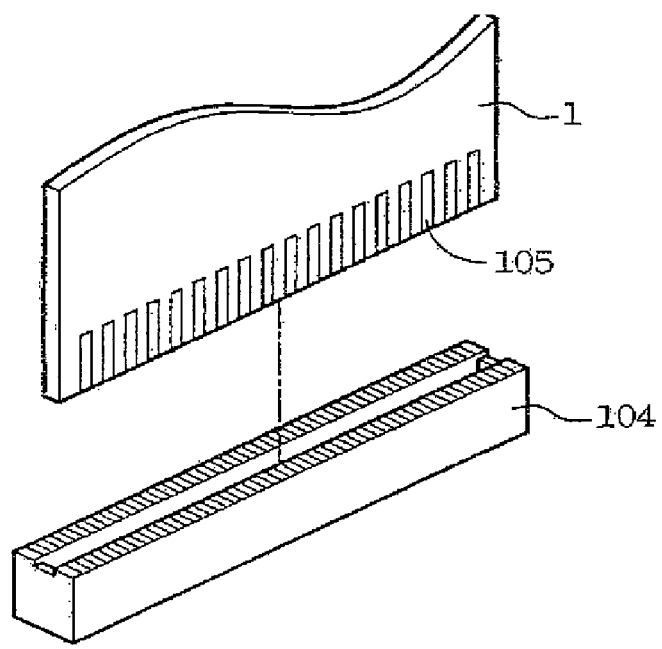
FIG. 2 is schematic view of the flexible FPC connecting another connecter in prior arts.
Figure 3:
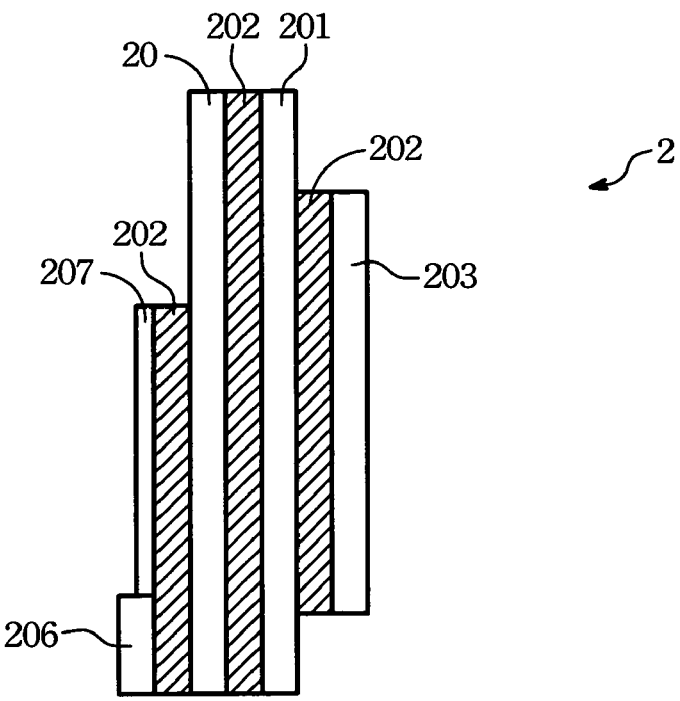
FIG. 3 is a schematic lateral view of a flexible FPC of the present invention.

Please refer to FIG. 3, which is a schematic lateral view of a flexible FPC 2 of the present invention. Wherein the flexible FPC 2 includes a base board 20, a copper layer 201, a cover layer 203, and a film 207. The copper layer 201 is attached to a surface of the base board 20. The film 207 is attached to another surface of the base board 20. Further, the cover layer 203 is attached to another surface of the copper layer 201. The base board 20 is usually made of PI with yellow-brown color and PET with colorless. There is a copper layer 201 rolled on the surface of the base board 20. The copper layer 201 is etched to form circuit patterns needed by means of chemicals with soul or alkali and light etching procedures. Between the base board 20 of the flexible FPC 2 and the copper layer 201 is usually added an adhesive 202 for bonding. The adhesive 202 is normally epoxy resin or acrylic fiber. For a whole thickness of the flexible FPC conforming as needed, the thickness of the FPC is controlled in the range of 0.09~0.12 mm.

For avoiding the surface of the copper layer 201 of the base board 20 being damaged or contaminated, one more cover layer 203 is coated on the surface of the copper layer 201. The cover layer 203 is a film and has the same material with the base board 20 for protecting the circuits of the copper layer 201.

Further, a front end of the base board 20 has a connector 206. The flexible FPC 2 can be through the connector 206 to connect other FPCs or troughs of other circuits. Since an endpoint in the trough is formed by means of electroplate tin or lead-tin, and the connector 206 is plated with tin of 5~15 μm, which is called "Golden finger". By means of connecting the connector 206 and the trough, therefore the flexible FPC is electrically connected other FPCs.

The film 207 is attached to the surface of the base board 20 and close to the connector 206. In the preferred embodiment, the film 207 is made of Polyethylene Terephthalate and the thickness of the film is smaller than 0.15 mm. So, for attaching to the base board 20, the film 207 may be low viscosity.

While a user inserting in and pull out from the FPC and the connector causes stress focused on the front end of the FPC, particularly, the connector located on the front end and constructed by the "Golden finger" is relatively heavier than the whole FPC. So the contacting lines of the front end are easily occurred broken circuits and damaged the flexible FPC.

Hence, the present invention is to add a low viscosity film attached to the FPC for increasing the whole thickness of the FPC so as to reduce to the possibilities of outside injury and broken of the thinner FPC while in test or the processes of inserting in and pulling out. After that, before the FPC is delivered, taking off the film is to meet customer demand and achieve the quality control.

Figure 4:
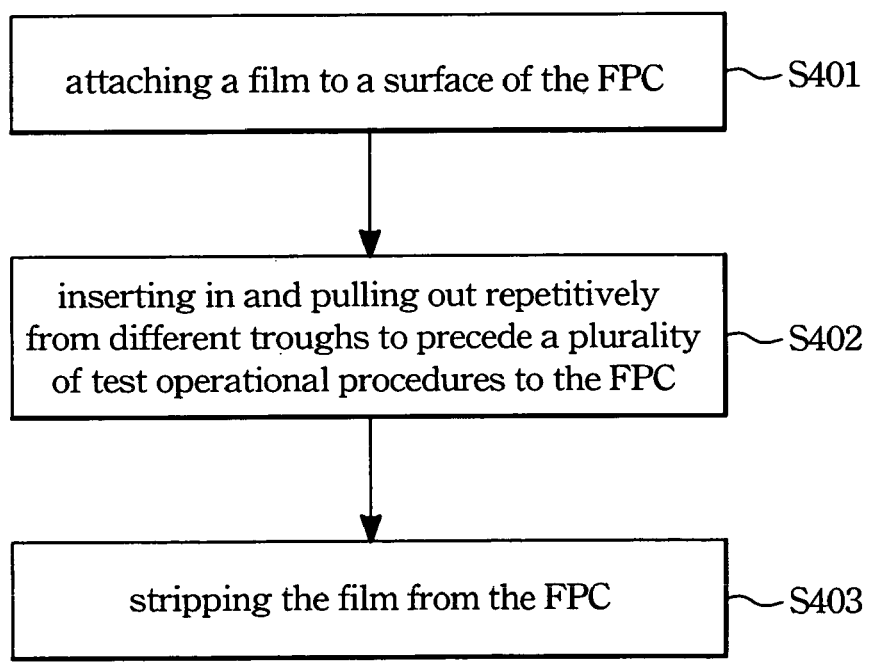
FIG. 4 is a flow chart of a method for preventing broken circuits of the FPC of the present invention.
Figure 5A:
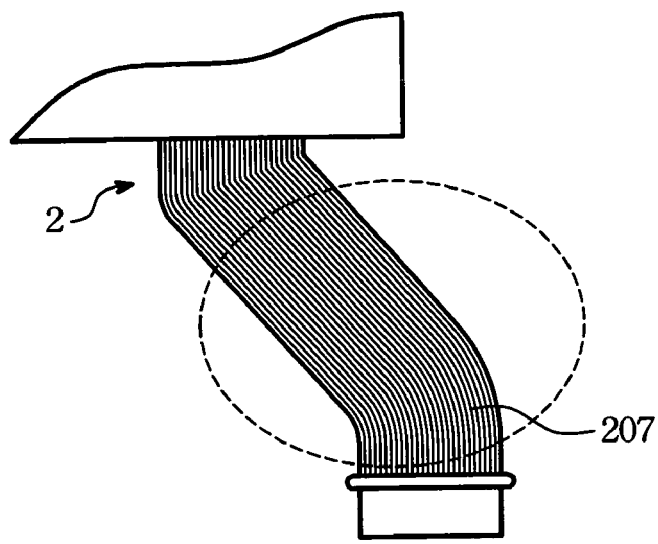
FIG. 5a is a schematic pattern view of a preferred embodiment of the FPC having a film of the present invention.
Figure 5B:
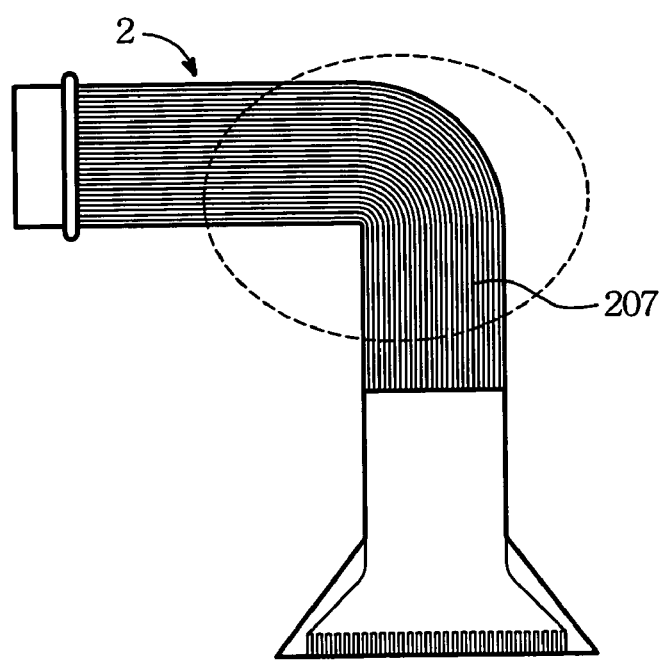
FIG. 5b is a schematic pattern view of another preferred embodiment of the FPC having a film of the present invention.

Referring to FIG. 4, which is a flow chart of a method for preventing broken circuits of the FPC of the present invention. The method comprises: the step S401, which is to attach a film to a surface of the FPC; the step S402, which is to insert in and pull out repetitively from different troughs to precede a plurality of test operational procedures to the FPC, the test operational procedures further comprises several tests by means of test machines; and the step S403, which is to strip the film from the FPC Referring to FIG. 5a and FIG. 5b, each is a schematic pattern view of a preferred embodiment of the FPC having a film of the present invention. The film 207 is attached to the surface of the FPC 2 and close to the connector so as to enhance the hardness of the FPC 2 and reduce the possibility of the broken circuit of the FPC 2 while inserting in and pulling out from toughs. FIG. 5a and FIG. 5b show two different structures of the FPC 2. Please be noted, the film 207 must be close to the connector for enhancing the hardness of the FPC.

Comparing to the prior arts, the film attached to the surface of the FPC of the present invention has following merits:

(1) Due to the FPC being in delivery, a low viscosity film is attached to the surface of the FPC while in manufacturing, therefore there is no additional work for film attachment. Further that, the film can add the whole thickness to reduce the outside injury and broken circuits of the FPC while in the test process. At last, the film can be taken off before delivering so as to achieve the slim volume of the FPC for customer demand and prevent the possibilities of the broken circuits. The present invention is thus capable of decreasing the defect rate from 2.17% to 0%.

(2) In the aspect of the test of the external FPC, the FPC is often touched while inserting in and pulling out from the trough to scratch the surface or damage the appearance. The film can decrease the defect rate from 30% down to 0.06%.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A test method for preventing broken circuits of a flexible printed circuit (FPC), comprising:
    (1) attaching a film to a surface of the FPC, wherein a front end of the FPC has a connector;
    (2) inserting the connector of the FPC in different sockets of other circuits in sequence for performing test operational procedures; and
    (3) stripping the film from the FPC.

2. The test method of claim 1, wherein the film attached to the surface of the FPC is close to the connector.

3. The test method of claim 1, wherein the FPC has a thickness ranging from about 0.09 to about 0.12 mm.

4. The test method of claim 1, wherein the film has a thickness less than 0.15 mm.

5. The test method of claim 1, wherein the film is made of Polyethylene Terephthalate.

6. The test method of claim 1, wherein the film is a low viscosity of film.

* * * * *